United States Patent [19]

Sinclair

[11] Patent Number: 4,632,484
[45] Date of Patent: Dec. 30, 1986

[54] CONNECTOR FOR CERAMIC HYBRID CIRCUITS FOR WELL-LOGGING TOOLS AND METHOD FOR CONNECTING CERAMIC HYBRID CIRCUITS FOR USE IN WELL-LOGGING TOOLS

[75] Inventor: Paul L. Sinclair, Houston, Tex.

[73] Assignee: Schlumberger Technology Corporation, Houston, Tex.

[21] Appl. No.: 644,832

[22] Filed: Aug. 27, 1984

Related U.S. Application Data

[63] Continuation of Ser. No. 403,597, Jul. 30, 1982, abandoned.

[51] Int. Cl.[4] .............................................. H01R 9/09
[52] U.S. Cl. .......................... 339/75 MP; 339/17 CF; 339/255 R
[58] Field of Search .......... 339/17 CF, 75 M, 75 MP, 339/176 MP, 108 TP, 255 R, 30, 91 R

[56] References Cited

U.S. PATENT DOCUMENTS

| | | | |
|---|---|---|---|
| 3,676,776 | 7/1972 | Bauer et al. | 339/108 TP |
| 3,904,262 | 9/1975 | Cutchan | 339/17 CF |
| 3,953,101 | 4/1976 | Palecek | 339/17 CF |
| 4,278,311 | 7/1981 | Scheingold et al. | 339/17 CF |
| 4,341,433 | 7/1982 | Cherian et al. | 339/17 CF |
| 4,345,810 | 8/1982 | Bakermans | 339/17 CF |
| 4,354,720 | 10/1982 | Bakermans | 339/17 CF |

OTHER PUBLICATIONS

Program Data Incorporated Catalog No. 104, "Probe Contacts and Sockets".
3M, Textool Products Department Brochure, "Sockets/Carriers for Test, Burn-in and Production Applications".
3M, Textool Products Department Brochure, "Chip Carrier Sockets".

Primary Examiner—John McQuade
Attorney, Agent, or Firm—Francis Hagel; Michael D. Rostoker

[57] ABSTRACT

A connector for a ceramic hybrid circuit to operatively associate the circuit to a cartridge chassis within a well-logging tool in a well borehole, has a plurality of spring-loaded electrically conductive contact pins which support the ceramic hybrid circuit so that it may sufficiently and freely move, without damage thereto, as a result of thermal expansion and contraction caused by temperature changes in the borehole and the ceramic hybrid circuit is sufficiently restrained to prevent damage thereto from shock and vibration forces exerted upon the well-logging tool.

9 Claims, 7 Drawing Figures

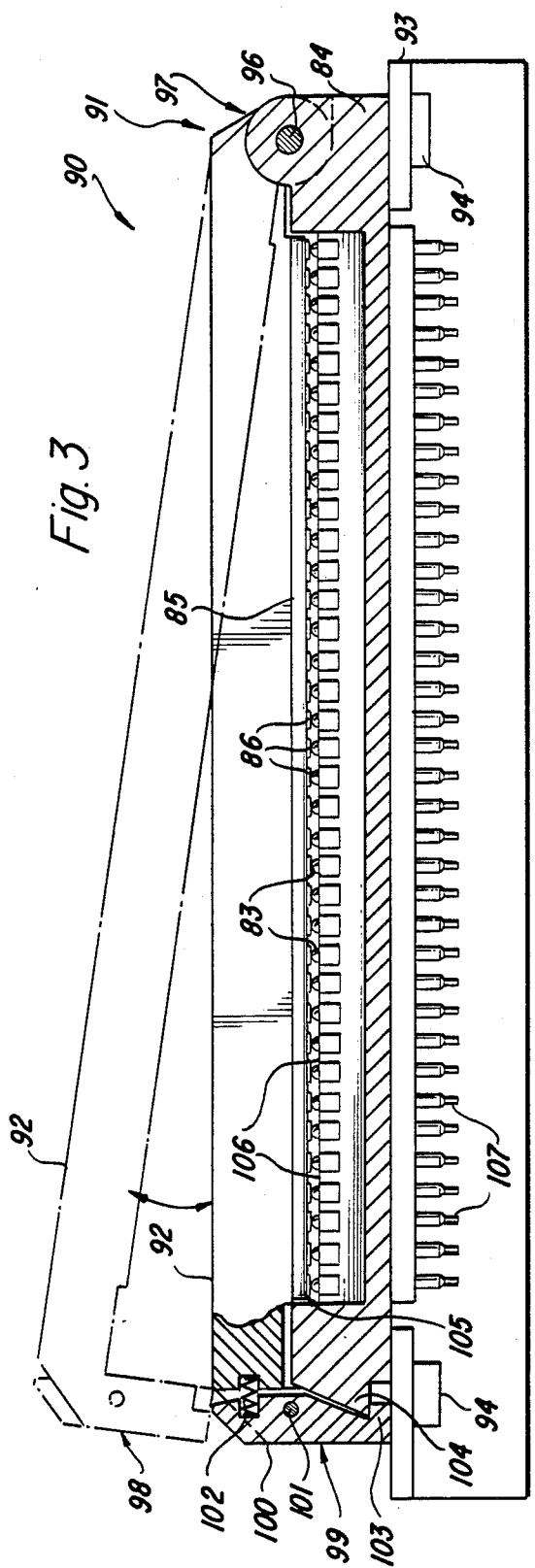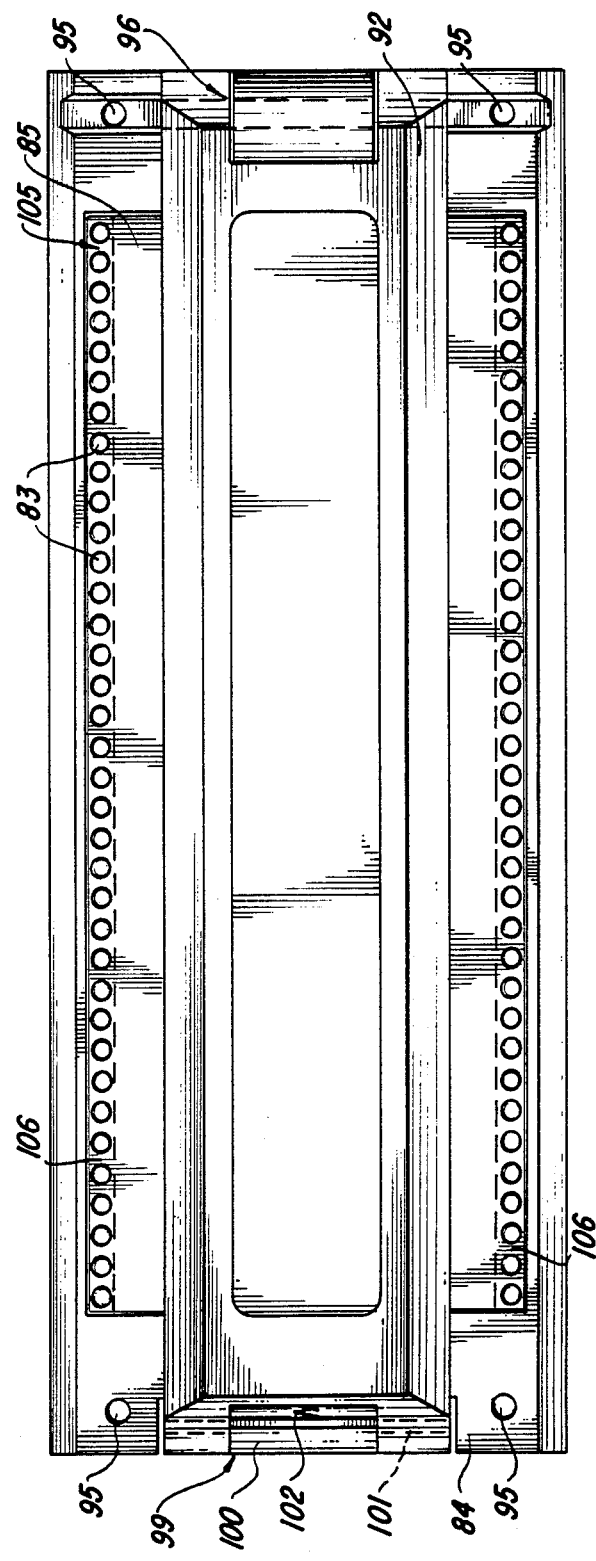

CONNECTOR FOR CERAMIC HYBRID CIRCUITS FOR WELL-LOGGING TOOLS AND METHOD FOR CONNECTING CERAMIC HYBRID CIRCUITS FOR USE IN WELL-LOGGING TOOLS

This is a continuation of application Ser. No. 403,597, filed July 30, 1982, now abandoned.

FIELD OF THE INVENTION

The invention relates to: a connector for a ceramic hybrid circuit to operatively associate the circuit to a cartridge chassis within a well-logging tool in a well borehole; a connector assembly for a ceramic hybrid circuit to mechanically connect the circuit to a cartridge chassis within a well-logging tool in a well borehole; and a method for electrically connecting a ceramic hybrid circuit to other circuits within a well-logging tool intended for use in a well borehole.

DESCRIPTION OF THE PRIOR ART

In well-logging tools, for use in a well borehole, numerous types of instrumentation are disposed within the well-logging tool to measure various types of information from the well borehole, as is well known in the art. The well-logging instrumentation is subjected to a unique range of severe environmental conditions during the operation of such instrumentation. A combination of cycles of extreme temperature differentials—typically $-25°$ to $+275°$ C.—and severe shock and vibration forces, often leads to mechanical failure of some of the instrumentation components in the well-logging tool. The problem is fundamental to any assembly of dissimilar materials, and is a result of mismatched coefficients of thermal expansion of the dissimilar materials. The problem is further compounded by the necessity of having the component parts with mismatched coefficients of thermal expansion to be firmly attached to one another to avoid destructive interference in the event of shock loadings or harmonic resonances caused by vibration forces. In well-logging tool instrumentation, it is increasingly desirable to have hybrid integrated circuits based upon large ceramic substrates which must be mechanically connected to various cartridge chassis, which are commonly manufactured of stainless steel or other metals, and electrically connected to other circuits in the tool via multiple electrical contacts.

One approach to overcome the foregoing described problems has been to rigidly join the dissimilar materials by a member that is free to deflect elastically to accomodate differential expansion of the dissimilar materials. Thus a third dissimilar material is interposed between the two dissimilar materials, the third material having a coefficient of thermal expansion intermediate those of the two parts to be joined. This approach may reduce the severity of the differential expansion of the components; however, mechanical resonances caused by vibration may be severe.

Another approach to the foregoing described problem has been to join the two dissimilar materials by a material that deforms plastically. This approach may be a successful solution to the foregoing problem for components that do not have to be regularly replaced, particularly if the exposure to high temperature conditions tends to aid plastic deformation and subsequent recovery. However, the major disadvantage associated with the foregoing approach is that most plastic materials will suffer eventual failure through repeated plastic-flow cycles. Additionally, because of the extreme temperature and pressure conditions in a borehole, as well as potentially severe shock and vibration forces, well-logging instrumentation components tend to require to be regularly replaced. With both of the previously described solutions, in order to replace failed ceramic hybrid circuits, the use of specialized extraction or soldering tools to remove the ceramic hybrid circuit from the well-logging tool is required.

Accordingly, prior to the development of the present invention, there has been neither a method for electrically connecting a ceramic hybrid circuit to other circuits within a well-logging tool, nor a connector for a ceramic hybrid circuit to mechanically connect the circuit to a cartridge chassis within a well-logging tool in a well borehole, which: is not subject to destructive interference in the event of shock loadings or harmonic resonances caused by vibration; allows failed ceramic hybrid circuits to be readily replaced without specialized extraction or soldering tools; and is capable of withstanding cycles of extreme temperature differentials in the borehole without causing mechanical failure, such as cracking, of the ceramic hybrid circuits. Therefore, the art has sought a method of electrically connecting ceramic hybrid circuits, and a connector therefor, for use with a well-logging tool within a well borehole, which: allows failed ceramic hybrid circuits to be readily replaced in the well-logging tool; is capable of withstanding cycles of extreme temperature differentials; and avoids destructive interference in the event of shock loadings or harmonic resonances caused by vibration forces.

SUMMARY OF THE INVENTION

In accordance with the invention, the foregoing advantages have been achieved through the present connector for a ceramic hybrid circuits to mechanically connect the circuit to a cartridge chassis within a well-logging tool in a well borehole. The present invention includes: a base member adapted to be secured to the cartridge chassis; a latch member engageable with the base member; and a plurality of spring-loaded electrically conductive contact pins for supporting and contacting the ceramic hybrid circuit between the base member and the latch member, whereby the ceramic hybrid circuit may sufficiently and freely move, without damage thereto, with respect to the base member and latch member as a result of thermal expansion and contraction caused by temperature changes in the borehole, while the ceramic hybrid circuit is sufficiently restrained to prevent damage thereto from shock and vibration forces exerted upon the well-logging tool which are imparted to the cartridge chassis, and the ceramic hybrid circuit will remain in low resistance electrical contact with the contact pins and the cartridge chassis. A feature of the present invention resides in the fact that the latch member may be pivotably mounted to the base member by a hinge mounted on a first end of the latch member, and the second end of the latch member is provided with a releasable latch which engages the base member.

Another feature of the present invention is that the contact pins may have spherical contact surfaces which contact the ceramic hybrid circuit, whereby electrical contact between the spherical contact surfaces and the ceramic hybrid circuit is made without a scrubbing action to the ceramic hybrid circuit, and the spherical contact surface passes through any contaminants, particularly organic contaminants, on the ceramic hybrid circuit. A further feature of the present invention is that the base member may include means for positioning the ceramic hybrid circuit with respect to the base member to prevent gross movement of the ceramic hybrid circuit under severe shock conditions, and the positioning means may comprise a recessed support surface which generally conforms to the outer configuration of the ceramic hybrid circuit when the ceramic hybrid circuit has experienced its greatest expansion due to increased temperature conditions in the borehole. Another feature of the present invention is that the plurality of contact pins may be disposed in the recessed support surface and extend outwardly therefrom.

An additional feature of the present invention is that the forces exerted by the spring-loaded contact pins against the ceramic hybrid circuit are sufficient to make an electrical connection therebetween and to oppose any relative motion between the ceramic hybrid circuit and the base member when an external shock force is transmitted through the well-logging tool in any direction, but particularly in a direction perpendicular to the forces exerted by the spring-loaded contact pins.

The present invention also includes a connector assembly for a ceramic hybrid circuit to electrically connect the circuit to other electrical circuits within a well-logging tool intended for use in a well borehole. The connector assembly of the present invention includes: a base member adapted to be secured to the cartridge chassis; a latch member engageable with the base member; a ceramic hybrid circuit disposed between the latch member and the base member, the circuit having a plurality of electrical contact surfaces thereon; and a plurality of spring-loaded electrically conductive contact pins for supporting the ceramic hybrid circuit between the base member and the latch member and for contacting the electrical contact surfaces of the ceramic hybrid circuit, whereby the ceramic hybrid circuit may sufficiently and freely move, without damage thereto, with respect to the base member and latch member as a result of thermal expansion and contraction caused by temperature changes in the borehole, while the ceramic hybrid circuit is sufficiently restrained to prevent damage thereto from shock and vibration forces exerted upon the well-logging tool which are imparted to the cartridge chassis, and the ceramic hybrid circuit contact surfaces will remain in low resistance electrical contact with the contact pins.

An additional feature of the connector assembly of the present invention is that the contact pins may have spherical contact surfaces which contact the ceramic hybrid circuit contact surfaces, whereby electrical contact between the spherical contact surface and the ceramic hybrid circuit contact surfaces is made without a scrubbing action to the ceramic hybrid circuit contact surfaces, and the spherical contact surface passes through any contaminants, particularly organic contaminants, on the ceramic hybrid circuit. A further feature of the connector assembly of the present invention is that the electrical contact surfaces of the ceramic hybrid circuit may be flat, and thus may conform to the flat surface of the ceramic substrate.

The present invention also includes a method for electrically connecting a ceramic hybrid circuit to other circuits within a well-logging tool intended for use in a well borehole. The method includes the steps of: securing a base member to the cartridge chassis, disposing a plurality of spring-loaded electrically conductive contact pins with a first end of each contact pin in electrically conductive relationship with a wiring harness coupled to other circuits in the well logging tool; placing the ceramic hybrid circuit upon the base member in an overlying relationship to the contact pins; engaging a latch member to the base member; supporting the ceramic hybrid circuit between the base member and the latch member by a second end of each contact pin; allowing the ceramic hybrid circuit to sufficiently and freely move with respect to the base member and latch member, without damage thereto, as a result of thermal expansion and contraction thereof caused by temperature changes in the borehole; and causing the ceramic hybrid circuit to remain in low resistance electrical contact with the second end of each contact pin.

A feature of the method of the present invention includes the steps of: providing the contact pins with spherical contact surface to contact the ceramic hybrid circuit; preventing a scrubbing action between the contact pins and the ceramic hybrid circuit; and passing the spherical contact surface through any contaminants, particularly organic contaminants, on the ceramic hybrid circuit. Another feature of the method of the present invention includes the steps of: exerting and transmitting a sufficient force from the second ends of the contact pins to the ceramic hybrid circuit to make an electrical connection therebetween and opposing any relative motion between the ceramic hybrid circuit and the base member when an external shock force is transmitted through the well-logging tool in any direction, but particularly in a direction perpendicular to the forces exerted by the contact pins.

The method for electrically connecting a ceramic hybrid circuit and the connector assembly, for use within a well-logging tool in a well borehole, when compared with previously proposed prior art connectors and methods of connecting, have the advantages of: allowing free thermal expansion and contraction of the ceramic hybrid circuit; avoids destructive interference in the event of shock loadings or harmonic resonances caused by vibrations; being able to withstand cycles of extreme temperature differentials while minimizing mechanical failure, such as cracking of the ceramic hybrid circuit; and not requiring specialized extraction or soldering tools when repairing and replacing failed ceramic hybrid circuits.

BRIEF DESCRIPTION OF THE DRAWINGS

In the drawings:

FIG. 3 is a side view of a connector and connector assembly in accordance with the present invention;

FIG. 4 is a top view of a connector and connector assembly in accordance with the present invention;

While the invention will be described in connection with the preferred embodiment, it will be understood that it is not intended to limit the invention to that embodiment. On the contrary, it is intended to cover all alternatives, modifications, and equivalents as may be included within the spirit and scope of the invention as defined by the appended claims.

DETAILED DESCRIPTION OF THE INVENTION

Figure 1:
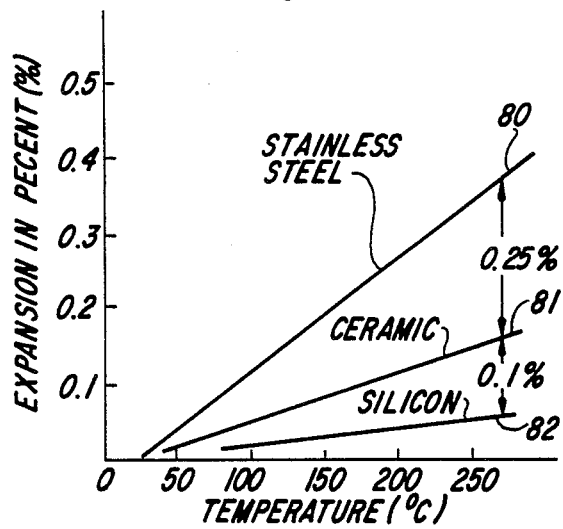
FIG. 1 is a graph illustrating problems of joining dissimilar materials having different coefficients of thermal expansion.

With reference to FIG. 1, the fundamental problem of the wide divergence in expansion of dissimilar materials as a result of their different coefficients of thermal expansion is illustrated. As seen in FIG. 1 the percentage expansion of three materials is plotted against increasing temperature, the upper temperature ranges corresponding to the extreme temperatures experienced in a well borehole. The stainless steel plot 80 represents the normal material of the well-logging tool housing and cartridge chassis of the well-logging tool. The plot 81 for alumina ceramic materials represent the ceramic material used for hybrid circuit substrates. Plot 82 represents the percentage expansion of silicon, the most commonly used material for active electronic instrumentation devices. Such silicon devices may be attached rigidly to the ceramic without causing failure. As illustrated in FIG. 1, alumina ceramics will not tolerate strains much greater than 0.1% without failure, such as a cracking of the alumina ceramic hybrid circuit substrate. Thus, free and sufficient motion is required between the alumina ceramic substrate and the metal, such as stainless steel, components of the well-logging tool housing and cartridge chassis members when the total differential expansion approaches 0.25% over a 300° C. range.

Figure 2:
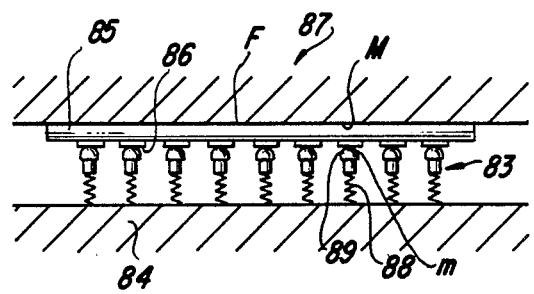
FIG. 2 is a schematic diagram of a connector in accordance with the present invention.

In accordance with the present invention, a principle of operation of the connector, connector assembly, and method therefor is illustrated in FIG. 2. A plurality of spring-loaded contact pins 83 is shown schematically and is disposed between a base member 84, and a ceramic hybrid circuit substrate 85 which has the hybrid circuit disposed thereon, including a plurality of flat, planar contact surfaces 86. The ceramic hybrid circuit substrate 85, hybrid circuit, and flat planar hybrid circuit contact surfaces 86 are well known in the hybrid circuit art, and are designed in accordance with the desired well-logging instrumentation to be utilized to measure various property characteristics in the well borehole The ceramic hybrid circuit substrate 85 may, for example, be relatively large, such as 3.8×9.1 cm., with a rectangular configuration. Substrate 85 may have many contact surfaces 86 disposed thereon, even several hundred; as shown herein, 36 contact surfaces are disposed along each of the longer sides of the ceramic hybrid circuit substrate 85. The ceramic hybrid circuit substrate 85 is disposed between the contact pins 83 and a base chassis member 87. Each spring-loaded contact pin 83 includes a spring 88 and a contact pin contact surface 89 which preferably has a spherical configuration as illustrated in FIG. 2, as will be hereinafter described in greater detail. Thus, a plurality of multiple, independent electrical contacts is provided between contact surfaces 86 and the spherical contact surfaces 89 of contact pins 83. In order to provide a reliable low-resistance electrical circuit, which circuitry and its related components, as will be hereinafter described, can withstand the severe shock, vibration, and temperature environment of a well borehole, sufficient forces from the springs 88 of contact pins 83 must be exerted against the contact surfaces 86 of the ceramic hybrid circuit substrate 85.

Still with reference to FIG. 2, the force in each contact pin 83 must be sufficient to make electrical connection at the mating contact surfaces 86 of ceramic hybrid circuit substrate 85 and contact surface 89 of contact pin 83, and oppose any motion of the moveable contact surfaces 89 of contact pins 83, which have a mass m. A total force of nf is applied for n contacts 89, acting against the total mass M of the entire ceramic hybrid circuit substrate 85. The critical acceleration factor G which will cause relative motion of the ceramic hybrid circuit substrate 85 if applied in a direction opposite to the spring forces nf is then given by the following formulae:

For the contact surface 86, 89/substrate 85 connection, $$G_{CS} = fg/m$$

For the substrate 85/base chassis 87 connection, $$G_{SB} = nfg/m$$

where G is measured in units of g, the universal acceleration constant due to gravity.

The self-resonant frequencies of the corresponding mechanisms may be readily determined from the same constants:

For the movable contact surface 89, $$F_c = \frac{1}{2\pi} \sqrt{\frac{Sg}{m}}$$

For the ceramic hybrid circuit substrate 85, $$F_s = \frac{1}{2\pi} \sqrt{\frac{nSg}{M}}$$

Where $S$ = Contact spring-rate

= $f/d$ $d$ = Spring deflection at force $f$.

As an example, some typical values for the various parameters used in well-logging tools are:

f = 100 gm. force
m = 0.04 gm.
n = 72
d = 0.2 cm.
M = 30 gm.
g = 981 cm./sec then, $G_{CS}$ = 2500 g
$G_{SB}$ = 240 g
$F_C$ = 557 Hz
$F_S$ = 173 Hz The foregoing results for $G_{CS}$, $G_{SB}$, $F_C$, and $F_S$ are consistent with the requirements of well-logging tools.

Still with reference to FIG. 2, it should be noted that when the forces encountered by a well-logging tool are transmitted to the ceramic hybrid circuit substrate 85, base chassis member 87, and base member 84 in a direction orthogonally to the axis of springs 88, the ceramic hybrid circuit substrate 85 is restrained by frictional forces between the substrate 85 and base chassis member 87. If the frictional constant at the interface between base chassis member 87 and ceramic hybrid circuit substrate 85 is F, then a lateral acceleration factor may be calculated as follows:

For the lateral substrate 85/base chassis 87 connection, $$G_{SBL} = nfF/M$$

This lateral motion is undesirable since it may cause a "scrubbing" of the electrical contact surfaces 86 and 89 which, if sustained for extended periods of time, will cause eventual failure of the contacts. However, since F may be in the range of 0.8–1.0 dependent upon the substrate 85/base chassis 87 interface properties, then:

$$192 \, g < G_{SBL} < 240 \, g$$

which value should not promote a scrubbing action of the electrical contacts 86 and 89. Isolated incidents of such scrubbing action may however be tolerated, if caused by occasional extreme shock forces, without significant damage.

Of paramount importance, is that the foregoing lateral friction force between the ceramic hybrid circuit substrate 85 and base chassis member 87 is insufficient to unduly restrain the differential expansion between the ceramic hybrid circuit substrate 85 and the base chassis member 87 caused by increased temperatures in the well borehole, whereby there is only a very remote possibility of the ceramic hybrid circuit substrate 85 fracturing as a result of such differential expansion. Thus, the ceramic hybrid circuit substrate 85 may freely and sufficiently expand in response to increased temperature conditions, while at the same time a reliable low-resistance electrical circuit is provided between the contacts 89 and 86 which can withstand severe shock and vibration forces which are encountered by well-logging tools in a well borehole.

With reference now to FIGS. 3 and 4, the connector 90 and connector assembly 91 of the present invention will be described in greater detail. The connector 90 and connector assembly 91 of the present invention incorporate the principles previously described with respect to FIGS. 1 and 2. As seen in FIGS. 3 and 4, the ceramic hybrid circuit substrate 85, having the hybrid circuit and its contact surfaces 86 thereon is disposed between a base member 84 and a latch member 92 engageable with the base member 84. As seen in FIG. 3, in dotted lines, latch member 92 is shown in an open position, and in solid lines in a closed position engaged to base member 84. Base member 84 is adapted to be secured to a cartridge chassis 93 which is disposed within a well-logging tool (not shown). Cartridge chassis 93 may normally be made of stainless steel and is provided with screw threads 94 adapted to receive a bolt (not shown) which passes through openings 95 in base member 84, whereby base member 84 is secured to the cartridge chassis 93. Base member 84 and latch member 92 may be manufactured of any suitable material; however, it is preferred that base member 84 be manufactured of an electrically non-conductive plastic material such as a silicone resin/glass powder composite, and latch member 92 may be manufactured of aluminum. Base member 84 should have a coefficient of thermal expansion close to that of the cartridge chassis 93. With reference to FIGS. 2 and 3, it should be noted that base member 84 is the same in both figures, and base chassis member 87 of FIG. 2 has latch member 92 substituted therefor in FIG. 3. Thus, the geometry of the various components, and the previously described formulae and calculations, are likewise applicable to the connector 90 and connector assembly 91 of FIGS. 3 and 4.

Still with reference to FIGS. 3 and 4, it is seen that latch member 92 is pivotably mounted to the base member 84 as by a hinge 96 disposed on a first end 97 of latch member 92, and the second end 98 of latch member 92 is provided with a releasable latch 99 which engages the base member 84 as seen in FIG. 3. Releasable latch 99 may include a spring-loaded tab 100 which pivots about a pivot pin 101, the lower end of tab 100 being normally biased toward the latch member 84 as by a spring 102. The lower end of tab 100 may preferably have a projection 103 formed therein which engages a mating projection 104 disposed on the base member 84 as seen in FIG. 3.

Still with reference to FIGS. 3 and 4, it is seen that a plurality of spring-loaded, electrically conductive contact pins 83 are disposed on the base member 84 for supporting and contacting the ceramic hybrid circuit substrate 85 between the base member 84 and the latch member 92, whereby the ceramic hybrid circuit substrate 85 may sufficiently and freely move, without damage thereto, with respect to the base member 84 and latch member 92 as a result of thermal expansion and contraction caused by temperature changes in the borehole, while the ceramic hybrid circuit substrate 85 is sufficiently restrained to prevent damage thereto from shock forces and vibration forces exerted upon the well-logging tool which are imparted to the cartridge chassis 93. Further, the ceramic hybrid circuit substrate 85 and ceramic hybrid circuit contact surfaces 86 will remain in low-resistance electrical contact with the contact pins 83 and the cartridge chassis 93, as previously described and explained with reference to FIG. 2.

Still with reference to FIGS. 3 and 4, it is seen that the base member 84 may include means for positioning ceramic hybrid circuit substrate 85 with respect to base member 84 to limit any gross movement of the ceramic hybrid circuit substrate 85 under severe shock and vibration conditions. The means for positioning 105 may comprise a recessed support surface 106 which generally conforms to the outer configuration of the ceramic hybrid circuit substrate 85, when the ceramic hybrid circuit substrate 85 has experienced its greatest expansion due to increased temperature conditions in the borehole. The recessed support surface 106 is seen in FIG. 4 as including a recessed ledge (shown in dotted lines) extending the length of the two longer sides of the ceramic hybrid circuit substrate 85. Preferably, the plurality of contact pins 83 are disposed in the recessed support surface 106, and the contact pins 83 extend outwardly from the recessed support surface 106 as seen in FIG. 3. As discussed with respect to FIG. 2, the forces exerted by the spring-loaded contact pins 83 upon ceramic hybrid circuit substrate 85 and ceramic hybrid circuit contact surfaces 86 are sufficient to make an electrical connection therebetween and to oppose any relative motion between the ceramic hybrid circuit and substrate 85 and the base member 84, when an external shock force is transmitted through the well-logging tool in any direction but particularly a direction perpendicular to the forces exerted by the spring-loaded contact pins 83.

Figure 5:
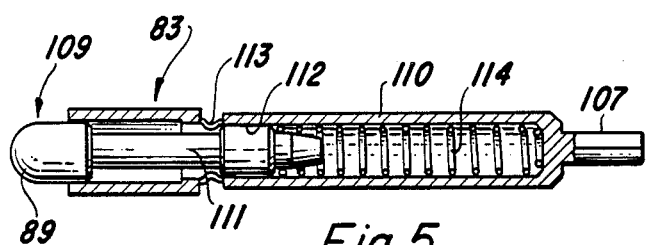
FIG. 5 is a partial cross-sectional view of a contact pin of the connector in accordance with the present invention.

As shown in FIGS. 3 and 5, contact pins 83 have a first end 107 intended for connection to an electrical wiring harness, a plurality of insulated electrical wires, (not shown), so that connections may be made between electrical circuits on the hybrid circuit 85 and other circuits in the well-logging tool. The second end 109 of contact pins 83 has a spherical contact surface 89 for contacting the ceramic hybrid circuit contact surfaces 86. With reference to FIG. 5, the structure of the contact pins 83 is shown to include a generally cylindrical housing 110 having a contact member 111 disposed therein for relative movement therebetween. Contact member 111 has the spherical contact surface 89 at one end and an enlarged end portion 112 which is restrained from outward movement from housing 110 as by a crimped portion 113 in housing 110. A suitable spring 114 is captured between the end of housing 110 and the enlarged end portion 112 of contact member 111.

Figure 6:
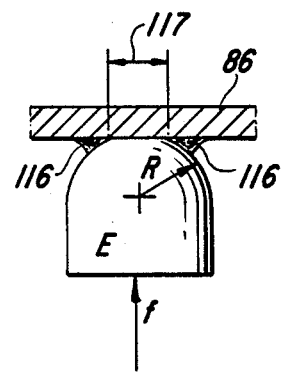
FIG. 6 is a schematic force diagram illustrating the forces between the connector pins and ceramic hybrid circuit contacts, in accordance with the present invention.
Figure 7:
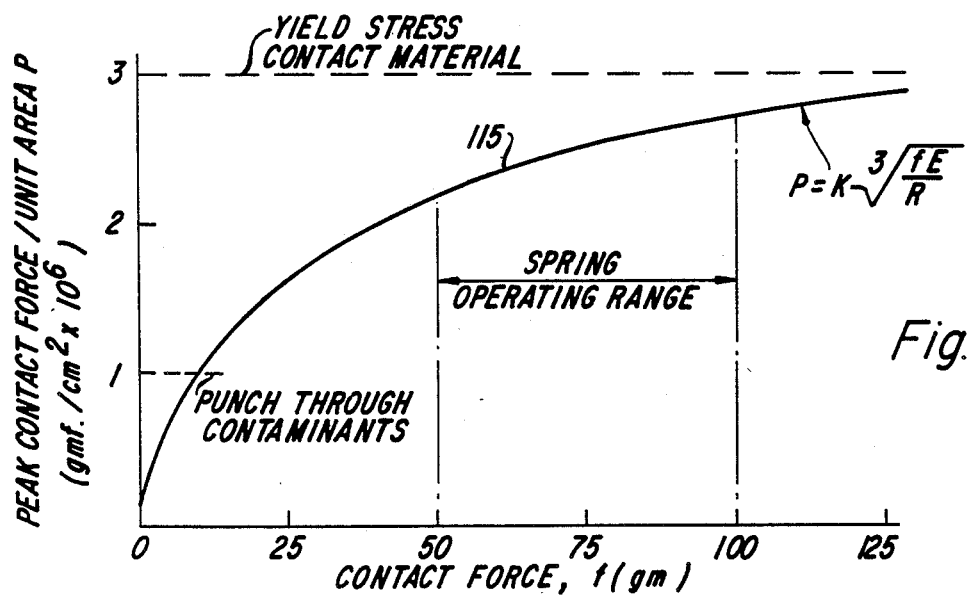
FIG. 7 is a graph illustrating the relationship between the contact force and contact force per unit area of the contact pin and ceramic hybrid circuit in accordance with the present invention.

With reference to FIGS. 6 and 7, the details of operation of the contact pins 83 will be described in greater detail. In FIG. 6, f represents the force exerted by spring 114 of contact pin 83, R represents the radius of curvature of the spherical contact surface 89 of contact member 111, E represents the elastic modulus for the material of which the spherical contact surface 89 is manufactured, and 86 represents the flat, planar contact surface of the ceramic hybrid circuit and substrate 85. Electrical contact is made between the spherical contact surface 89 and the flat, planar contact surface 86 of ceramic hybrid circuit and substrate 85 without a scrubbing action, as previously described, as a result of the very high pressure force available when a spherical surface, such as spherical contact surface 89, comes into contact with a flat, planar surface, such as contact surface 86. Preferably, the two contact surfaces 89 and 86 are noble-metal surfaces, contact surface 86 preferably being a thick-film gold material disposed on the ceramic hybrid circuit substrate 85.

It should of course be recognized by one skilled in the art, that contact pins 83 could be associated with the latch member 92 with the first ends 107 of contact pins connected to other circuits in the well-logging tool as by an electrical wiring harness. Ceramic hybrid circuit 85 would then be disposed on base member 84 with the contact surfaces 86 facing upwardly to be engaged by the spherical contact surfaces 89 of the second ends 109 of the contact pins 83, upon latch member 92 being closed as shown in FIG. 3.

With reference to FIG. 7, the plotted curve depicts how the peak contact force/unit area rises to a value sufficient to enable the spherical contact surface 89 to pass through any contaminants, particularly all known organic contaminants 116, as seen in FIG. 6, which may be present on the contact surface 86. The plotted curve 115 also depicts how the spherical contact surface 89 may be deformed elastically as the contaminants 116 are swept aside, until the force/unit area approaches the elastic limit for the material of which spherical contact surface 89 is manufactured. In FIG. 6, the arrows 117 illustrate the contact area between contact surfaces 89 and 86 due to elastic deformation of the spherical contact surface 89. Thus, a reliable electrical connection between contact surfaces 89 and 86 may be obtained without the need to plastically deform the contact material of spherical contact surface 89 by correctly choosing the radius R of the spherical contact surface 89, and a material having the requisite elastic modulus E to manufacture the spherical contact surface 89, and a force f resulting from the compression of spring 114.

With reference to FIG. 3, the method for electrically connecting a ceramic hybrid circuit 85 to a cartridge chassis 93 within a well-logging tool in a well borehole in accordance with the present invention will be described. The method steps include securing the base member 84 to the cartridge chassis 93, such as by bolts (not shown), which mate with threaded openings 94 in cartridge chassis 93. A plurality of spring-loaded, electrically conductive contact pins 83 is then disposed with first end 107 of each contact pin 83 in electrically conductive relationship with a wiring harness (not shown). The ceramic hybrid circuit 85 is then placed upon the base member 84 in an overlying relationship to the contact pins 83. Latch member 92 is then engaged to the base member 84, as by the latch 99. The ceramic hybrid circuit and substrate 85 is then supported between the base member 84 and the latch member 92 by a second end 109 of each contact pin 83. The ceramic hybrid circuit and substrate 85 is allowed to sufficiently and freely move, with respect to the base member 84 and the latch member 92, without damage thereto, as a result of thermal expansion and contraction thereof caused by temperature changes in the borehole. The ceramic hybrid circuit and substrate 85 is caused to remain in a low-resistance electrical contact with the second end 109 of each contact end 83. The contact pins 83 are provided with spherical contact surfaces 89 to contact the ceramic hybrid circuit contact surfaces 86 and a scrubbing action between the contact pins 83 and the ceramic hybrid circuit contact surfaces 86 is prevented. The spherical contact surfaces 89 are passed through any organic contaminants 116 on the ceramic hybrid circuit contact surfaces 86.

It is to be understood that the invention is not limited to the exact details of construction, operation, exact materials, or embodiment shown and described, as obvious modifications and equivalents will be apparent to one skilled in the art; for example, the latch member could be provided with a latch at either of its ends for engagement with the base member, and additional rows of contact pins could be provided. Accordingly, the invention is therefore to be limited only by the scope of the appended claims.

I claim:

1. A connector for a ceramic hybrid circuit to operatively associate the circuit to a cartridge chassis within a well-logging tool intended for use in a well borehole, comprising:

a base member adapted to be secured to the cartridge chassis and including means for positioning the ceramic hybrid circuit with respect to the base member to prevent gross movement of the ceramic hybrid circuit under severe shock conditions, said positioning means comprising a recessed support surface which generally conforms to the outer configuration of the ceramic hybrid circuit when the ceramic hybrid circuit has experienced its greatest expansion due to increased temperature conditions in the borehole;

a latch member engageable with the base member; and a plurality of electrically conductive contact pins for supporting and contacting the ceramic hybrid circuit between the base member and the latch member, said plurality of pins being disposed in the recessed support surface and extending outwardly therefrom, each of said pins having an elongate housing member supported by the base member, a contact member mounted on the housing member and axially slidable with respect thereto toward an extended position in which the end of the contact member protrudes from the housing member to contact the hybrid circuit and a spring mounted between the housing member and the contact member to urge the latter towards said extended position, the springs of the contact pins having a spring force sufficient to exert a combined force upon the ceramic hybrid circuit to sufficiently restrain the ceramic hybrid circuit to prevent damage thereto from contact scrubbing action, shock and vibration forces exerted upon the well-logging tool which are imparted to the partidge chassis, and to maintain the cermaic hybrid circuit in low resistance electrical contact with the contact pins.

2. The connector of claim 1 wherein the latch member is pivotable mounted to the base member by a hinge mounted on a first end of the latch member, and the second end of the latch member is provided with a releasable latch which engages the base member.

3. The connector of claim 1 wherein each of said contact members has a spherical end surface, whereby electrical contact between the spherical contact surface and the ceramic hybrid circuit is made without a scrubbing action to the ceramic hybrid circuit, and the spherical contact surface passes through any contaminants, particularly any organic contaminants, on the ceramic hybrid circuit.

4. The connector of claim 1 wherein the forces exerted by the spring-loaded contact pins against the ceramic hybrid circuit are sufficient to make an electrical connection therebetween and to substantially prevent any relative motion between the ceramic hybrid circuit and the base member when an external shock force is transmitted through the well-logging tool in any direction, but particularly in a direction perpendicular to the forces exerted by the spring-loaded contact pins.

5. A connector assembly for a ceramic hybrid circuit to mechanically connect the circuit to a cartridge chassis within a well-logging tool intended for use in a well borehole, comprising:

a base member adapted to be secured to the cartridge chassis and including means for positioning the ceramic hybrid circuit with respect to the base member to prevent gross movement of the ceramic hybrid circuit under severe shock conditions, said positioning means comprising a recessed support surface which generally conforms to the outer configuration of the ceramic hybrid circuit when the ceramic hybrid circuit has experienced its greatest expansion due to increased temperature conditions in the borehole;

a latch member engageable with the base member;

a plurality of electrically conductive contact pins for supporting the ceramic hybrid circuit between the base member and the latch member and for contacting the electrical contact surfaces of the ceramic hybrid circuit, said plurality of pins being disposed in the recessed support surface and extending outwardly therefrom; each of said pins having an elongate housing member supported by the base member, a contact member mounted on the housing member and axially slidable with respect thereto toward an extended position in which the end of the contact member protrudes from the housing member to contact the hybrid circuit and a spring mounted between the housing member and the contact member to urge the latter towards said extended position, the springs of the contact pins having a spring force sufficient to exert a combined force upon the ceramic hybrid circuit to sufficiently restrain the ceramic hybrid circuit to prevent damage thereto from contact scrubbing action, shock and vibration forces exerted upon the well-logging tool which are imparted to the cartridge chassis, and to maintain the ceramic hybrid circuit in low resistance electrical contact with the contact pins.

6. The connector assembly of claim 5, wherein the latch member is pivotably mounted to the base member by a hinge mounted on a first end of the latch member, and the second end of the latch member is provided with a releasable latch which engages the base member.

7. The connector assembly of claim 5, wherein each of said contact members has a spherical end surface, whereby electrical contact between the spherical contact surface and the ceramic hybrid circuit contact surfaces is made without a scrubbing action to the ceramic hybrid circuit contact surfaces and the spherical contact surface passes through any contaminants, particularly organic contaminants, on the ceramic hybrid circuit.

8. The connector assembly of claim 7, wherein the electrical contact surfaces of the ceramic hybrid circuit are flat.

9. The connector assembly of claim 5, wherein the forces exerted by the spring-loaded contact pins against the ceramic hybrid circuit contact surfaces are sufficient to make an electrical connection therebetween and to substantially prevent any relative motion between the ceramic hybrid circuit and the base member when an external shock force is transmitted through the well-logging tool in a direction perpendicular to the forces exerted by the spring-loaded contact pins.

* * * * *